United States Patent
Sander et al.

(10) Patent No.: US 6,534,878 B1
(45) Date of Patent: Mar. 18, 2003

(54) OPTIMIZING THE POWER CONNECTION BETWEEN CHIP AND CIRCUIT BOARD FOR A POWER SWITCH

(75) Inventors: Rainald Sander, München (DE); Chihao Xu, München (DE)

(73) Assignee: Siemens Aktiengesellschaft, Munich (DE)

( * ) Notice: Subject to any disclaimer, the term of this patent is extended or adjusted under 35 U.S.C. 154(b) by 536 days.

(21) Appl. No.: 09/101,371

(22) PCT Filed: Nov. 11, 1997

(86) PCT No.: PCT/DE97/02631

§ 371 (c)(1),
(2), (4) Date: Jul. 8, 1998

(87) PCT Pub. No.: WO98/21751

PCT Pub. Date: May 22, 1998

(30) Foreign Application Priority Data

Nov. 11, 1996 (DE) .......................................... 196 46 472

(51) Int. Cl.⁷ .............................................. H01L 23/48
(52) U.S. Cl. ...................... 257/784; 257/676; 257/690; 257/691; 257/692; 257/773; 257/786
(58) Field of Search ................................ 257/666, 676, 257/773, 786, 784, 690–692, 734, 573, 582, 587

(56) References Cited

U.S. PATENT DOCUMENTS 5,029,267 A * 7/1991 Masuda et al. ............. 331/107

FOREIGN PATENT DOCUMENTS

JP 0446937 A2 * 12/1992 ........... H01L/21/60

OTHER PUBLICATIONS

PROFET "Online" Updated Mar. 4, 1997, Available from Internet: <URL:HTTP://WWW.Siemens.DE/Semiconductor/Products/36/3634.HTM XP002063574, pp. 1–1 through 2–7.
Electronics, vol. 59, No. 27, Jul. 24, 1986, S. Zollo, "The Boom Starts in Smart Power Products", XP 000051602, pp. 97–101.
Motorola, Electronic, vol. 42, No. 21, XP 002063575, Oct. 19, 1993, Smartmos–Technologie: Was Macht Motorola?, pp. 28–29.
Electronics, vol. 40, No. 14, Jul. 9, 1991, Guenther van Treek et al, Hochstrom–Motortreiber–ICS Ein Schritt Zur Multiplextechnik Im Auto, XP 000241415, pp. 58–61.
EDN—Electrical Design News, vol. 33, No. 7, Mar. 31, 1988, XP 000118770, Dave Pryce, Associate Editor, "SMART–POWER", pp. 113–123.

* cited by examiner

Primary Examiner—Eddie Lee
Assistant Examiner—Matthew E. Warren
(74) Attorney, Agent, or Firm—Schiff Hardin & Waite

(57) ABSTRACT

For optimizing the power connection between semiconductor chip and conductor frame in a semiconductor switch, the bond wires that form the power path input of the power part are symmetrically bonded on the conductor frame. The length of the bond wires is then the same and shorter than in an asymmetrical connection since bonding is carried out from two sides.

2 Claims, 2 Drawing Sheets

Optimized line connection for high currents

PIN 2,4 : IC Inputs/outputs / PIN 1,5 : Power path output
PIN 3 : Power path input
(e.g. back side of the IC)

PIN 1,2,4 : IC Inputs/Outputs
PIN 5: Power path output
PIN 3: Power path input
(e.g.: back side of the IC)

1,2: IC Inputs/Outputs
PIN 4,5: Power path output
PIN 3 : Power path input

Optimized line connection for high currents

PIN 2,4 : IC inputs/outputs  / PIN 1,5 : Power path output

PIN 3 : Power path input
(e.g. back side of the IC)

"Stitch"-Point

Loop

"Stitch"-Point

OPTIMIZING THE POWER CONNECTION BETWEEN CHIP AND CIRCUIT BOARD FOR A POWER SWITCH

BACKGROUND OF THE INVENTION

The invention is directed to a semiconductor element composed of an integrated semiconductor chip with at least one power MOSFET or a power bipolar transistor and a signal-processing circuit that processes a weak-current signal, whereby each circuit comprises terminal surfaces that are connected to a conductor frame via a plurality of bond wires.

Such a component is disclosed, for example, by European reference EP 0 446 937 B1. The subject matter of European EP reference 0 446 937 B1 is herewith expressly incorporated by reference into the present application.

The semiconductor components shown therein (FIGS. 1 and 2) are usually low-impedance semiconductor switches wherein the resistance of the line connection between the semiconductor chip and the conductor frame is no longer negligible. This line also limits the maximally allowable load current.

Further, the metallization that connects the power transistor to the bond wire exhibits a clear resistance part due to the large area of the semiconductor chip. Since the current density in the metallization is very high around the bond contact, this also leads to a non-uniform temperature distribution on the chip and to a reduction of the service life of the chip.

The solutions known from the Prior Art provide one or more bond wires, all of which are contacted to the outer conductor frame, for the line connection. The plurality and thickness of the bond wires is based on the on-state d.c. resistance of the semiconductor switch and on the available bond area on the conductor frame.

Both the resistance of the bond wire as well as the resistance of the metallization are highest when only one bond wire is employed. The result is still unsatisfactory when two contact locations on the conductor frame or, respectively, two bond wires are employed.

The capture area of the bond wires differ greatly, so that the utilization of the semiconductor chip is reduced. The current conduction through the two bond wires is likewise asymmetrical, so that the load current allowed overall through the bond wires does not rise linearly.

SUMMARY OF THE INVENTION

It is therefore an object of the present invention to improve a semiconductor component of the species initially cited to such effect that a significantly better line connection can be produced between the power part of a semiconductor switch and the conductor frame.

This object is inventively achieved in that the power MOSFET or the power bipolar transistor comprises an input/output at the back side of the semiconductor chip and comprises two symmetrically arranged inputs/outputs at the front side, and in that the symmetrically arranged inputs/outputs at the front side are symmetrically connected to bond wires at both sides of the conductor frame. A noticeably improved connection is thereby produced. The optimization of this connection ensues via the bond wires at both sides of the conductor frame that are symmetrical and divide the semiconductor chip into two halves. The length of the bond wires is the same and shorter than in the asymmetrical connection known from the Prior Art since the chip is bonded from two sides.

The advantage of this line connection is comprised in the better division of current on the semiconductor chip due the optimally possible positioning of the bond contact on the metallization layer of the chip given this configuration. Since the currents through the bond wires are the same, the load current allowed overall through the bond wires increases linearly. The bond wire resistance is reduced. Overall, this connection yields a clearly reduced on-state d.c. resistance and a higher loadability given pre-conditions that are otherwise the same.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 4:
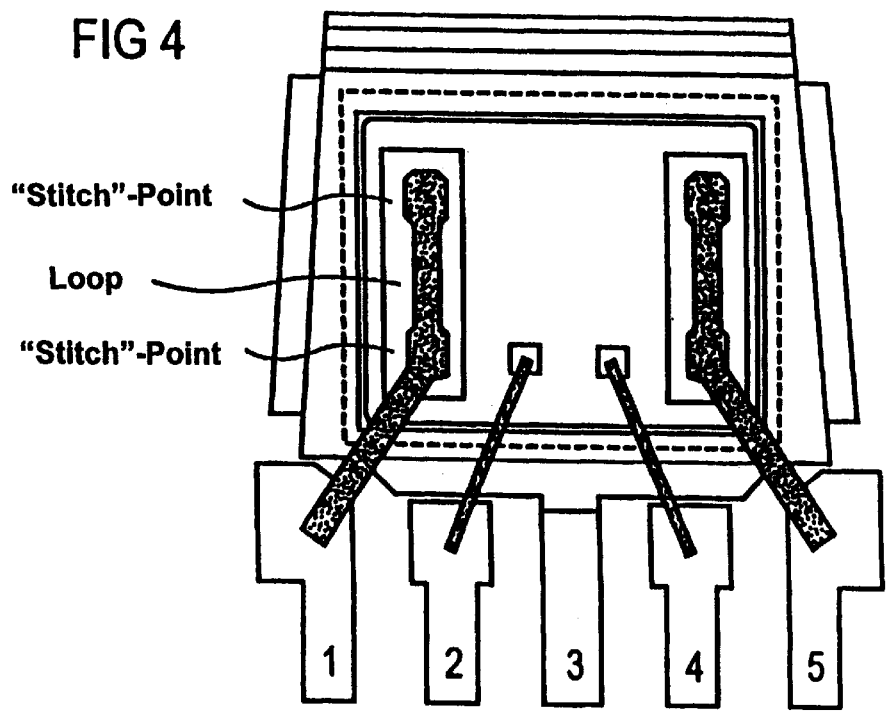

Given employment of very large semiconductor chips, "multiple stitching" can preferably be employed in the bonding, i.e. the bond wire comprises not only one but a plurality of contacts on the semiconductor chip (FIG. 4). As a result thereof, the capture area for each contact is divided down and the metallization resistance is greatly reduced. The effective length of the bond wire is shorter since the total current through the wire only flows after the last contact.

Figure 1:
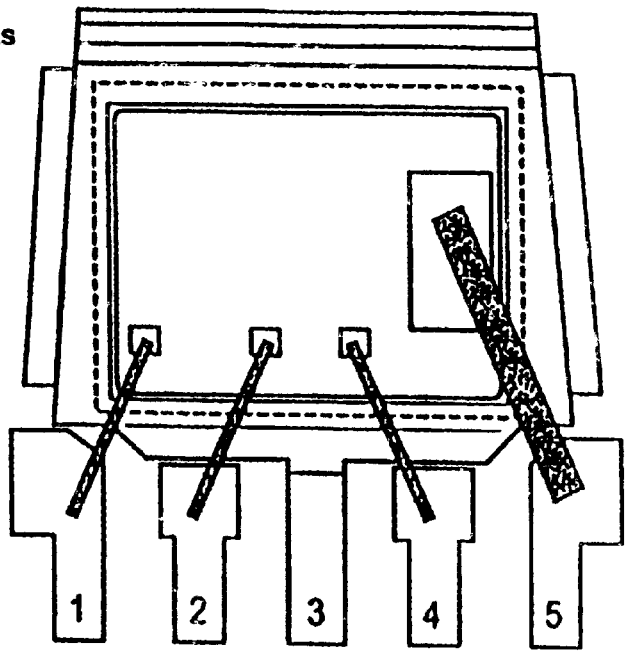
FIGS. 1 and 2 are schematic diagrams of prior art bonding pads.
Figure 2:
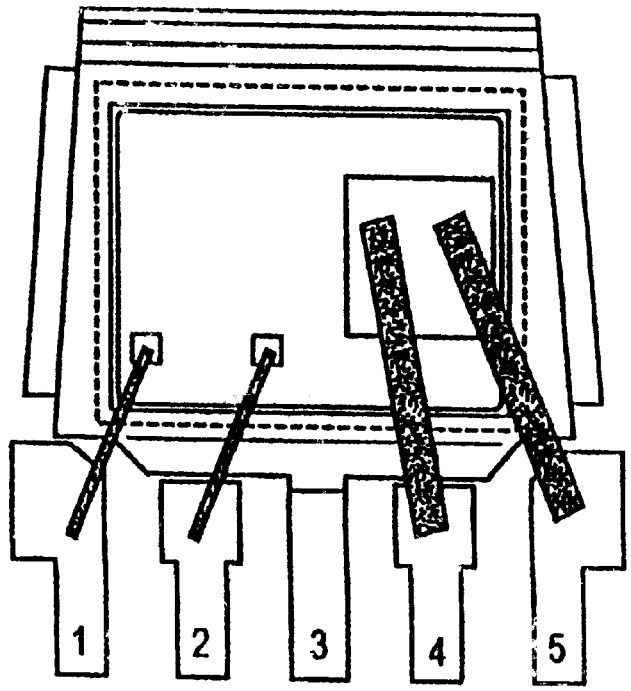
Figure 3:
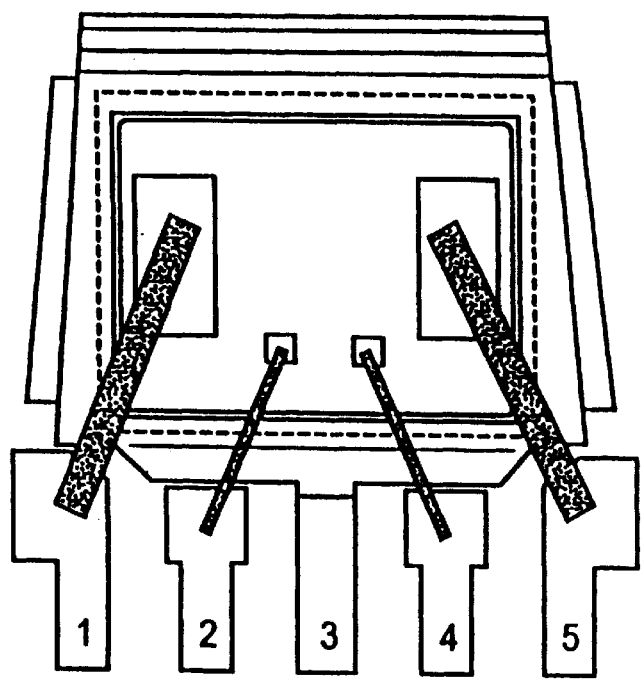
FIGS. 3 and 4 are schematic diagrams of bonding pads according to the present invention.

Over and above this, the symmetrical design (FIGS. 3 and 4) of the line connection allows a more dependably monitoring of the contact quality of bond wire to conductor frame and semiconductor chip. One example for the monitoring of the contact quality is the measurement of the on-state d.c. resistance over respectively only one bond wire connection. A difference in these two measured quantities is then a direct statement about the quality of the bond connection that has been achieved.

Overall, a power IC that exhibits a reduced on-state d.c. resistance, an increased loadability as well as an enhanced testability and a lengthened service life can be achieved with the semiconductor component of the present invention.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor component composed of an integrated semiconductor chip having a first large side and a second large side, comprising:
   one power MOSFET or one power bipolar transistor having first terminal surfaces for an input and an output;

a signal-processing circuit that processes a weak-current signal and that has second terminal surfaces on said second large side;

a conductor frame;

said first and second terminal surfaces connected to said conductor frame via a plurality of bond wires;

said power MOSFET or said power bipolar transistor having said input on said first large side and two symmetrically arranged outputs on said second large side; and said symmetrically arranged outputs bonded to said conductor frame via two symmetrically shaped bond wires carrying an almost same current.

2. A semiconductor having an integrated semiconductor chip, comprising;

the chip having a chip surface divided into first and second areas;

one power MOSFET or one power bipolar transistor having first terminal surfaces for at least an input and at least an output;

a signal-processing circuit that processes a weak-current signal and that has second terminal surfaces on said second area;

a conductor frame;

said first and second terminal surfaces connected to said conductor frame via a plurality of bond wires;

said power MOSFET or said power bipolar transistor having said input on said first area and two symmetrically arranged outputs on said second area; and said symmetrically arranged outputs bonded to said conductor frame via two substantially symmetrically shaped bond wires carrying currents of substantially equal value.

* * * * *